United States Patent [19]
Randall et al.

[11] 3,930,903
[45] Jan. 6, 1976

[54] STABILIZED SUPERCONDUCTIVE WIRES

[75] Inventors: Robert N. Randall; James Wong, both of Wayland, Mass.

[73] Assignee: Supercon, Inc., Natick, Mass.

[22] Filed: Feb. 7, 1974

[21] Appl. No.: 440,523

[52] U.S. Cl. .................. 148/32; 29/599; 148/34; 174/126 CP
[51] Int. Cl.² .................. H01L 39/00; H01B 12/00
[58] Field of Search .................. 148/34, 11.5 R, 32; 29/191.6, 599; 174/126 CP, DIG. 6

[56] References Cited
UNITED STATES PATENTS

| | | | |
|---|---|---|---|
| 3,541,680 | 11/1970 | Vertijp | 29/599 |
| 3,623,221 | 11/1971 | Morton et al. | 29/599 |
| 3,625,662 | 12/1971 | Roberts et al. | 29/599 |
| 3,807,041 | 4/1974 | McDougall | 29/599 |

*Primary Examiner*—W. Stallard
*Attorney, Agent, or Firm*—Jerry Cohen; Charles Hieken

[57] ABSTRACT

A stable, high field, high current conductor is produced by packing multiple, multi-layer rods of a bronze core and niobium or vanadium inner jacket and copper outer jacket into a pure copper tube or other means for forming a pure copper matrix, sealing, working the packed tube to a wire, and by diffusion, heat treating to form a type II superconducting, Beta-Wolfram structure, intermetallic compound as a layer within each of several filaments derived from the rods. The layer of Beta-Wolfram structure compound may be formed in less than 2 hours of diffusion heat treatment in a thickness of 0.5–2 microns.

6 Claims, 4 Drawing Figures

STABILIZED SUPERCONDUCTIVE WIRES

BACKGROUND OF THE INVENTION

The present invention relates to superconductors and more particularly to Type II superconductors made of intermetallic compounds of Beta-Wolfram structure.

Circa 1955, Matthias and co-workers at Bell Labs announced the discovery of niobium stannide $Nb_3Sn$ and its 18°K critical temperature which offered the promise of high critical fields and high critical currents. In the 1960's other Beta-Wolfram compounds were announced including $V_3Ga$ and many ternary and quatenary compounds based on $Nb_3Sn$ and $V_3Ga$ which afforded critical temperatures of 15° to 20°K and above. Great efforts were expended to make practical fabricable and usable forms of these compounds. In 1960–1963, Bell Laboratories, Superior Tube Corporation and Materials Research Corporation in the United States developed $Nb_3Sn$ wires made by packing niobium and tin powders or crushed $Nb_3Sn$ into niobium, Monel or copper tubes, drawing the packed tubes to wire size and diffusion heating to form superconductive cores of $Nb_3Sn$. At about the same time, General Electric Company developed a tin coated niobium wire which was similarly heated to produce an $Nb_3Sn$ layer, National Research Corporation developed co-reduced, metallurgically bonded, niobium-tin laminates which were similarly heated to produce $Nb_3Sn$ layers, Radio Corporation of America developed a chemcial vapor deposited $Nb_3Sn$ coating method, and Union Carbide developed an $Nb_3Sn$ plasma spraying process. Similar developments were made at other major U.S. industrial, government and university laboratories and abroad and offered commercially in the U.S. and abroad. Follow-up developments included soldering on stabilizing copper layers and the use of bronze sources of the tin or gallium components of the Beta-Wolfram compounds.

However, use of the Beta-Wolfram compounds was small compared to the lower critical current alloys Nb-Zr, Nb-ti, and Nb-Zr-Ti, because of greater stability, ease of fabrication and ductility of these alloys. A typical composite braided or cabled wire product based on the alloys is specified to carry 1000 amperes superconductively under 40 kilogauss external field and each wire of the braid comprises about 400 spaced niobium-titanium filaments in a stabilizing pure copper matrix.

Work in the U.K. (see U.S. Pat. No 3,728,165 to Howlett and U.S. Pat. No. 3,472,944 to Morton et al. and U.S. Pat. No. 3,807,041 to McDougall), in the U.S. (see U.S. Pat. 3,731,374 to Suenaga et al. and U.S. Pat. No. 3,838,503 to Suenaga et al.) and in Japan (see Applied Physics Letters January, 1974, Furuto et al.) has involved the production of Type II superconductors by reaction of niobium or vanadium with bronze containing gallium or tin. Such products are produced as wires comprising spaced filaments of niobium (for example) in a tin bronze matrix which has been drawn to a small cross sectional area. After drawing, the surface of the niobium is converted to $Nb_3Sn$ by a high temperature diffusion of tin from the bronze matrix into the niobium. While materials of the above type show considerable promise for high field superconductors they are somewhat limited in their stability and ultimate current carrying capacity.

It is an important object of the invention to provide Beta-Wolfram compound based wire and wire braid or cable products having stability approaching that of the above alloy products.

It is a further object of the invention to provide such Beta-Wolfram compound based products which are sufficiently ductile to be used in electromagnetic coil winding and like wire or wire braid and cable fabrication and usage.

It is a further object of the invention to produce such Beta-Wolfram compound based products with 2 hours or less of diffusion heating consistent with one or more of the preceding objects.

It is a further object of the invention to provide diffusion heating in a continuous tunnel kiln to eliminate spooled wire batch heat treatments.

It is a further object of the invention to make available the practical utilization of the high field, high current characteristics of the Beta-Wolfram compounds together with the electrical stability and mechanical characteristics of alloy conductors for magnetic coils, rotating electrical machinery, power transmission and the like.

As used herein, "wire" includes wires and wire-like ribbons, flattened wires and the like. Resistance ratio means ratio of electrical resistance measured at room temperature (300°K) to resistance measured at liquid helium temperature (4.2°K).

SUMMARY OF THE INVENTION

In the present invention a multifilamentary product is provided wherein the filaments comprise annular layers of niobium (for example) which are converted in part to $Nb_3Sn$ and all of the copper surrounding the niobium is high conductivity copper having a resistance ratio greater than 100 which imparts stability to the composite superconductor. This is achieved, in a preferred form of the invention when niobium and tin are used for form the niobium stannide superconductor, by providing a niobium tube which is filled with a tin bronze, this tube being inserted, along with a number of similar tubes, into a billet made by drilling spaced longitudinal holes in a pure copper ingot Alternatively, many such tubes may be jacketed with copper and packed together in a sheath to form a billet.

The composite billet is then reduced by suitable mechanical treatments such as extrusion, swaging, rolling, drawing and the like until the thickness of the wall of the niobium tubes has been reduced to about 2–5 microns. Thereafter the product is heated to a temperature on the order of 750°C for 0.5 to 2 hours to react most of the tin within the tin bronze interior of the tube with part or almost all of the niobium tube but preferably leaving at least a 2–4 micron niobium layer to provide strengthening reinforcement and protection of the copper from contamination.

The tin is not entirely consumed. Enough tin remains in the bronze so that the bronze has the high resistance (at 4.2°K, or to put it another way, low resistance ratio) characteristics of an alloy or impure copper rather than the high resistance ratio of pure copper. However, the pure copper of the matrix retains its high resistance ratio characteristic throughout processing.

The same processing may be applied to formation of superconductors using other refractory metals, e.g. vanadium, molybdenum, and other bronze cores, e.g. gallium bronze, to form other superconductive compounds of Beta-Wolfram structure.

The unreacted portion of the refractory metal layer of each filament is metallurgically bonded to the superconductive compound layer, formed at refractory layer/bronze core interface, and is also metallurgically bonded to the copper matrix essentially throughout the filament length and, since the filaments are continuous throughout the composite wire length, such metallurgical bonding is continuous throughout the wire length. The superconductive compound layers of the filaments are, in essence, then metallurgically bonded to the pure copper matrix. This provides the wire with enhanced stability compared to the above described bronze matrix composites and does so consistent with high current, high field specifications.

The residual (unreacted) portion of the refractory metal layer provides a strengthening reinforcement which puts the compound layer under compression under conditions of cooling to cryogenic temperatures and thus improves its mechanical performance. The refractory metal is also desirably compressed. The depleted bronze core is essentially free of composite weakening voids or stress concentration sites. There is no melting and resolidification of the bronze core in the course of diffusion heat treatment to produce the superconductive compound at the interface of the bronze core and refractory metal layer of each filament.

The end product conductor combines the high field, high critical temperature benefits of Beta-Wolfram compounds with the stability of the alloy conductors. The conductor of the invention may be used in production of magnets for plasma research at fields above 10 Tesla, large alternating current generators, inductive energy storage, particle accelerator and bubble chamber magnets, NMR apparatus, and homopolar motors, and as power line conductors and in other devices utilizing one or more of the benefits of higher field, higher current or higher temperature operation compared to state of the art devices of the same kind.

The above and other objects, features and advantages are now described in the following detailed description of preferred embodiments, taken in connection with the accompanying drawing in which:

DETAILED DESCRIPTION OF PREFERRED EMBODIMENTS

Figure 1:
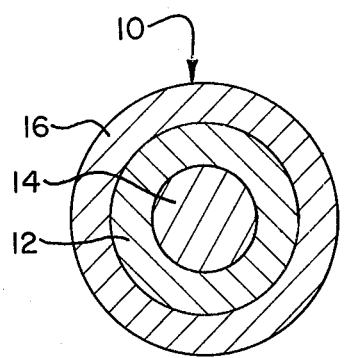
FIG. 1 is a cross-section view of a multi-layer rod for packing in a copper tube according to a first embodiment of the invention.

Referring now to the drawings and more particularly FIG. 1 thereof, there is shown a cross-section of an assembled component used in practicing the process of the invention. The component 10 comprises a seamless tube or centrally bored rod of refractory metal 12 encasing a core 14 of a tin bronze or gallium bronze. The refractory metal is selected from the group consisting of niobium and vanadium and their fabricable alloys including niobium-0.5 to 5.0 weight percent (w/o) zirconium; niobium-1 to 30 w/o tantalum; niobium-1 to 10 w/o molybdenum; vanadium-chromium, vanadium-titanium. Ternary or quatenary alloys may also be utilized in lieu of the elemental or binary alloy forms of vanadium and niobium. Niobium-1 w/o Zr is a preferred high strength refractory metal.

The bronze may be modified by addition of such elements as germanium, aluminum, or silicon as will produce a beneficial type II ternary compound upon subsequent diffusion heat treatment. The tin bronze may be used with niobium or niobium alloy jackets and the gallium bronze may be used with vanadium or vanadium alloy jackets to produce vanadium gallium ($V_3Ga$).

The component further comprises an outer jacket 16 of high conductivity copper such as OFHC brand. The component is preferably prepared by pre-assembly in large sizes such as 0.5 to 12 inches outer diameter and 0.43 to 11.5 inches inner diameter for tube 16, 0.43 to 11.5 inches outer diameter and 0.35 to 9.0 inches inner diameter for tube 12 and 0.35 to 9.0 inches diameter for core 14 with no spacing therebetween as may be accomplished by sinking or shrink fit techniques well known in the art. The thus assembled billet may be extruded or swaged to produce a long rod of 1/16 to ¾ inches outer diameter (all layers having proportional reduction to an areal basis corresponding to the areal billet to rod reduction ratio). The rod is cut to lengths of 6 to 24 inches.

Figure 2:
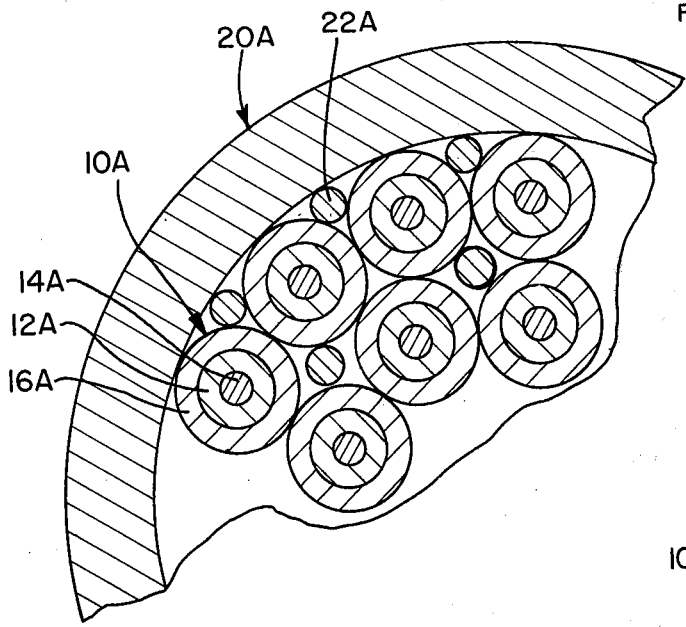
FIG. 2 is a cross-section view of a packed tube incorporating several of the FIG. 1 rods.

Referring now to FIG. 2, a multiplicity of rod lengths 10A, formed as described above in connection with FIG. 1, are packed into a copper alloy tubular form extrusion billet 20A, selected for its fabricability compatibility with the refractory metal. Additional OFHC wires 22A can be included in the interstices of the pack. The outer diameter of tubular billet 20A would be 2 to 12 inches and the inner diameter would be 90 to 95% thereof.

The components 10A comprise layers 14A, 12A, 16A corresponding to original layers 14, 12, 16 respectively. From 6 to 30,000 of the rod lengths 10A are packed into billet 20A. The billet has a nosed front end and is capped at its back end in accordance with conventional extrusion practice. It is extruded through an area reduction ratio of 10 to 100 times at a temperature of 500° to 650°C, extrusion force of 180 to 12,000 tons and speed of 10 to 40 inches per minute; quenched; and further worked by swaging and drawing. In the course of swaging or drawing, intermediate heat treatments of 500° to 650°C for 0.5 to 1 hour may be made on the composite product to counteract work hardening. Such anneals are preferably made after each 50% area reduction.

After the product reaches final wire size, the wire product is twisted at a rate of 0.1 to 15 twists per inch of running length and then subjected to a final heat treatment of 700° to 750°C for ½ to 100 hours for diffusion reaction of layers 12A and 14A.

Figure 3:
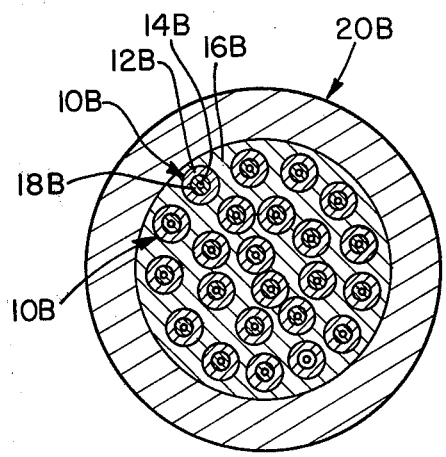
FIG. 3 is a cross-section view of the composite wire product produced from the FIG. 2 packed tube.

The resultant composite wire product, shown in FIG. 3, typically of about 10 mils diameter comprises a spaced array of filaments 10B in a copper matrix 16B enclosed by outer copper alloy layer 20B. Each filament comprises a refractory metal layer 12B having typically 8 micron outer and 5 micron inner diameter, a superconductive compound layer 18B having a radial thickness of up to two microns to comprise 10–50 volume percent of the filament, and a residual 2–4 micron diameter core 14B.

The wire drawing may be stopped at larger sizes than 10 mils, e.g. ¼ in. square or ¼ in. diameter, and resultant filament and filament component layer sizes will be correspondingly larger compared to those of the 10 mil diameter wire product described above. At smaller sizes, 10–20 mil wire diameter, the tin in the bronze core (as 13 w/o thereof) is functionally depleted after a short time of diffusion heat treatment on the order of ¼–1 hour. At larger sizes, there is enough tin in the bronze cores of the filaments to provide additional $Nb_3Sn$ through longer heating times on the order of 30–60 hours.

The wire may be made with complete or partial consumption of the niobium or other refractory metal layer of each filament. Partial consumption is preferred to provide the residual refractory metal layer as a contamination barrier and strengthening reinforcement. Even if the structural integrity of refractory metal layers is breached in random filaments, tin contamination is limited to local areas because of depletion of the tin supply afforded by a small bronze core of the filament containing the breached refractory metal layer and preferential attraction of the tin for niobium.

Figure 4:
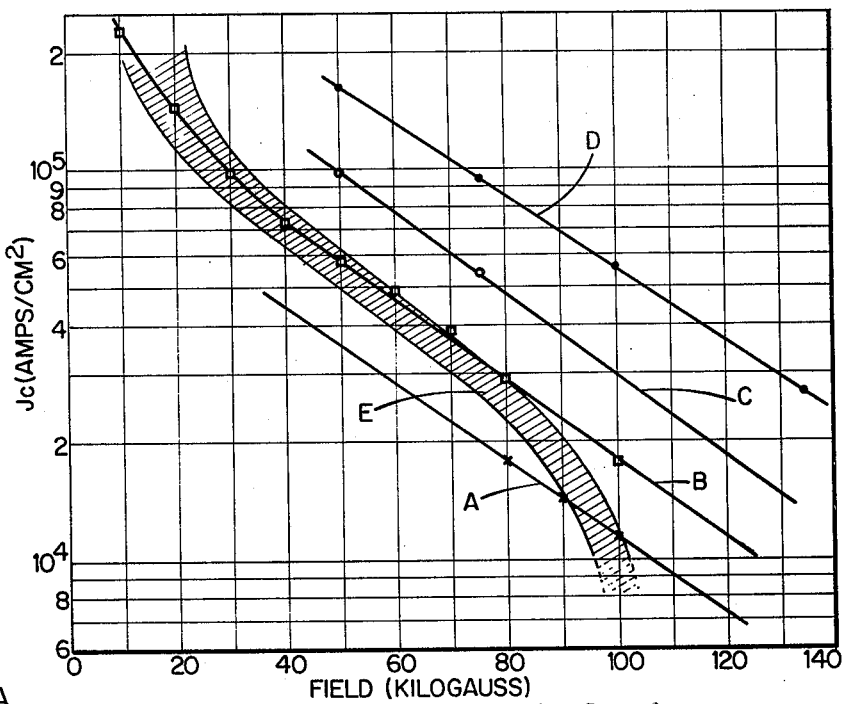
FIG. 4 is a graph showing current field performance of the composite wire-product of FIG. 3 and of prior art composite wire products.

The graph of FIG. 4 shows critical currents plotted against external field, testing at 4.2°k, for two wires (curves A and B) produced in accordance with the above described process and data for two wires (curves C and D) reported by the United Kingdom Atomic Energy Research Establishment, [UKAERE], assignee of the above cited Howlett patent and apparently produced in accordance with the method of that patent. The wires of the respective data curves have the following parameters:

|   | Wire Dia. | No. of Filaments | Vol % of Pure Cu. in Matrix | Diffusion Heat Treatment Time | Diffusion Heat Treatment Temp. |
|---|---|---|---|---|---|
| A | .068 inches | 400 | 50% | 60 hours | 750°C |
| B | .012 inches | 400 | 50% | 30 hours | 750°C |
| C | .006 inches | 343 | none | 50–100 hours | 600–800°C |
| D | .010 | 1369 | none | 50–100 hours | 600–800°C |

A shaded range of curves E is taken on commercially available 0.008, 0.011 and 0.016 inches diameter stable composite wires (VSF brand) containing 400 niobium-titanium filaments in aggregate volume proportions of 1:1 (copper: niobium-titanium).

The composite wires, characterized by curves A–D all provide a capability of operation at higher fields than the wires of E. The wires of curves A and B have dynamic electrical stability and mechanical properties more nearly approaching those of the wire of curve E than do the wires of curves C and D. A bulletin by UKAERE states that dynamic stability of the wires of curves C and D, and the like, could be improved by incorporating additional pure copper onto or into the matrix, e.g. by including pure copper filaments jacketed by a diffusion barrier material in the matrix positioned near the superconductor filaments. However, substantial enhancement of dynamic stability through that method would entail one or more of the costs of increased number of incorporated filaments, expanded cross-section area or a reduced reservoir of bronze (and therefore of tin or gallium) for use in production of the superconductive compound. Either of the latter consequences could entail a reduction in critical current as a cost of enhanced stabilization.

The diffusion heat treatment of the present invention may be practiced by batch heating rolled up spools of the drawn wire in an oven or by passing the wire through a tubular furnace. It has been discovered that filaments less than 10 microns diameter containing a 4–7 micron diameter bronze core can be heat treated in about 15 minutes to achieve sufficient diffusion and reaction at 700°–800°C for purposes of the present invention.

It is evident that those skilled in the art, once given the benefit of the foregoing disclosure, may now make numerous other uses and modifications of, and departures from the specific embodiments described herein without departing from the inventive concepts. Consequently, the invention is to be construed as embracing each and every novel feature and novel combination of features present in, or possessed by, the apparatus and techniques herein disclosed and limited solely by the scope and spirit of the appended claims.

What is claimed is:

1. Superconductive multi-filament wire product comprising,
   means defining a copper matrix with a plurality of spaced filaments therein,
   each of the filaments comprising a layer therein of type II superconducting intermetallic compound of Beta-Wolfram structure, being the diffusion reaction product of source filaments comprising a cross-section multilayer configuration of a refractory metal layer each containing component elements of the compound,
   the copper matrix having a resistance ratio greater than 100 and being essentially free of said component elements, and the diffusion layer being 0.5-2 microns thick, the compound layers of the fialments being metallurgically bonded to the copper matrix.

2. Superconductive multi-filament wire produced in accordance with claim 1 wherein said compound comprises $Nb_3Sn$, said refractory metal comprises niobium and said bronze comprises tin.

3. Superconductive multi-filament wire produced in accordance with claim 2 and further comprising,
   a niobium outer layer in each filament jacketing the compound layer thereof,
   said niobium layer being metallurgically bonded to said copper matrix.

4. Superconductive multi-filament wire product in accordance with claim 1 and further comprising,
   a residual part of said source refractory metal outer layer in each filament jacketing the compound layer thereof,
   said refractory metal being metallurgically bonded to said compound layer and to said copper matrix.

5. Superconductive multi-filament wire product in accordance with claim 1 wherein said compound comprises $V_3Ga$, said refractory metal comprises vanadium and said bronze comprises gallium.

6. Superconductive multi-filament wire product in accordance with claim 5 and further comprising,
   a residual vanadium layer in each filament metallurgically bonded to the compound layer thereof,
   said vanadium layer being metallurgically bonded to said bronze core.

* * * * *

UNITED STATES PATENT OFFICE
CERTIFICATE OF CORRECTION

Patent No. 3,930,903   Dated January 6, 1976

Inventor(s) Robert N. Randall; James Wong

It is certified that error appears in the above-identified patent and that said Letters Patent are hereby corrected as shown below:

Line 24, col. 6, please insert after "layer" --surrounding a bronze core, the bronze core and refractory metal layer--.

Signed and Sealed this

Twenty-seventh Day of February 1979

[SEAL]

Attest:

RUTH C. MASON
Attesting Officer

DONALD W. BANNER
Commissioner of Patents and Trademarks